United States Patent
Aranami

(10) Patent No.: US 11,011,718 B2
(45) Date of Patent: May 18, 2021

(54) SOLAR CELL AND METHOD FOR MANUFACTURING SOLAR CELL

(71) Applicant: KYOCERA Corporation, Kyoto (JP)

(72) Inventor: Junji Aranami, Otsu (JP)

(73) Assignee: KYOCERA Corporation, Kyoto (JP)

( * ) Notice: Subject to any disclaimer, the term of this patent is extended or adjusted under 35 U.S.C. 154(b) by 60 days.

(21) Appl. No.: 16/328,181

(22) PCT Filed: Aug. 31, 2017

(86) PCT No.: PCT/JP2017/031359
§ 371 (c)(1),
(2) Date: Feb. 25, 2019

(87) PCT Pub. No.: WO2018/043644
PCT Pub. Date: Mar. 8, 2018

(65) Prior Publication Data
US 2019/0198259 A1    Jun. 27, 2019

(30) Foreign Application Priority Data
Aug. 31, 2016   (JP) .............................. JP2016-169204

(51) Int. Cl.
*H01L 51/44*    (2006.01)
*H01L 31/054*   (2014.01)
(Continued)

(52) U.S. Cl.
CPC ............ *H01L 51/44* (2013.01); *H01L 31/054* (2014.12); *H01L 51/447* (2013.01); *H01G 9/209* (2013.01);
(Continued)

(58) Field of Classification Search
CPC ............ H01L 31/046–0468; H01L 51/42–448
See application file for complete search history.

(56) References Cited

U.S. PATENT DOCUMENTS

2008/0295889 A1  12/2008 Schindler et al.
2012/0211083 A1   8/2012 Seike et al.
(Continued)

FOREIGN PATENT DOCUMENTS

CN         104979477 A    10/2015
DE   10 2007 005 091 A1    8/2008
(Continued)

OTHER PUBLICATIONS

Moon, et al. "Laser-scribing patterning for the production of organometallic halide perovskite solar modules." IEEE Journal of Photovoltaics 5.4 (2015): 1087-1092.*
(Continued)

*Primary Examiner* — William E McClain
(74) *Attorney, Agent, or Firm* — Procopio Cory Hargreaves and Savitch LLP

(57) ABSTRACT

A solar cell includes elements, a connecting portion, and a transparent portion. The elements include first and second elements arrayed in a first direction. The transparent portion is located between the connecting portion and the second element. Each of the elements includes first and second electrode layers and a semiconductor layer interposed between the first and second electrode layers. Between the first element and the second element, their first electrode layers sandwich a first gap and their second electrode layers sandwich a second gap shifted in the first direction from the first gap. The connecting portion electrically connects the second electrode layer of the first element to the first electrode layer of the second element. The transparent portion is located between the second electrode layer of the first element and the first electrode layer of the second element at a position shifted in the first direction from the connecting portion.

8 Claims, 7 Drawing Sheets

(51) Int. Cl.
*H01L 31/0468* (2014.01)
*H01G 9/20* (2006.01)
*H01L 27/28* (2006.01)
*H01L 27/30* (2006.01)

(52) U.S. Cl.
CPC .......... *H01G 9/2081* (2013.01); *H01L 27/286* (2013.01); *H01L 27/301* (2013.01); *H01L 27/302* (2013.01); *H01L 31/0468* (2014.12); *H01L 51/442* (2013.01); *Y02E 10/549* (2013.01)

(56) References Cited

U.S. PATENT DOCUMENTS

| | | | | |
|---|---|---|---|---|
| 2014/0131868 | A1* | 5/2014 | Kippelen | H01L 51/5092 257/741 |
| 2014/0366941 | A1* | 12/2014 | Jee | H01L 31/05 136/256 |
| 2016/0005987 | A1* | 1/2016 | Koposov | H01L 51/4226 136/263 |
| 2017/0213933 | A1 | 7/2017 | Aranami | |

FOREIGN PATENT DOCUMENTS

| | | |
|---|---|---|
| EP | 1990846 A2 | 11/2008 |
| JP | 2007-317858 A | 12/2007 |
| JP | 2013-55216 A | 3/2013 |
| JP | 2013-219064 A | 10/2013 |
| WO | 2008/092679 A1 | 8/2008 |
| WO | 2016/017617 A1 | 2/2016 |

OTHER PUBLICATIONS

Löper, et al. "Organic-inorganic halide perovskite/crystalline silicon four-terminal tandem solar cells." Physical Chemistry Chemical Physics 17.3 (2015): 1619-1629.*
Kosasih, et al. "Electron Microscopy Characterization of P3 Lines and Laser Scribing-Induced Perovskite Decomposition in Perovskite Solar Modules." ACS applied materials & interfaces 11.49 (2019): 45646-45655.*
Konstantinos et al., Effect of Thermal Annealing on the Optical and Morphological Properties of (AETH)PbX4 (X = Br, I) Perovskite Films Prepared Using Single Source Thermal Ablation, Chemistry of Materials, vol. 12, No. 1, Dec. 15, 1999, pp. 169-175, XP55612071, ISSN: 0897-4756, DOI: 10.1021/cm9905161.

* cited by examiner

SOLAR CELL AND METHOD FOR MANUFACTURING SOLAR CELL

CROSS-REFERENCE TO RELATED APPLICATION

The present application is a National Phase entry based on PCT Application No. PCT/JP2017/031359 filed on Aug. 31, 2017, entitled "SOLAR CELL AND METHOD OF MANUFACTURING SOLAR CELL" which claims the benefit of Japanese Patent Application No. 2016-169204, filed on Aug. 31, 2016, entitled "SOLAR CELL AND METHOD FOR MANUFACTURING SOLAR CELL", the contents of which are incorporated by reference herein in their entirety.

FIELD

The present disclosure relates to a solar cell and a method for manufacturing a solar cell.

BACKGROUND

Solar cells include crystalline solar cells and thin film solar cells. The thin film solar cells each generally have a structure in which a plurality of solar cell elements arrayed on a substrate is electrically connected in series.

SUMMARY

A solar cell and a method for manufacturing a solar cell are disclosed.

An aspect of a solar cell includes a plurality of solar cell elements, a connecting portion, and a transparent portion. The plurality of solar cell elements are arrayed in a planar manner along a first direction, and include a first solar cell element and a second solar cell element that are adjacent to each other. The connecting portion electrically connects the first solar cell element to the second solar cell element. The transparent portion is located between the connecting portion and the second solar cell element. Each one of the plurality of solar cell elements includes a first electrode layer, a second electrode layer, and a semiconductor layer interposed between the first electrode layer and the second electrode layer. The first electrode layer of the first solar cell element and the first electrode layer of the second solar cell element are juxtaposed so as to sandwich a first gap. The second electrode layer of the first solar cell element and the second electrode layer of the second solar cell element are juxtaposed so as to sandwich a second gap. The second gap is provided at a position shifted in the first direction from the first gap. The connecting portion electrically connects the second electrode layer of the first solar cell element to the first electrode layer of the second solar cell element. The transparent portion is provided between the second electrode layer of the first solar cell element and the first electrode layer of the second solar cell element at a position shifted in the first direction from the connecting portion, and has higher light transmittance than that of the semiconductor layer. In addition, at least one of the first electrode layer and the second electrode layer has higher light transmittance than that of the semiconductor layer.

An aspect of a method for manufacturing a solar cell includes preparing a substrate, forming electrodes, forming a semiconductor region and forming a connecting portion and second electrode layer. The forming electrodes includes forming a first electrode layer arrayed first, and a first electrode layer arrayed second, on a surface of the substrate along a first direction in a planar manner. The forming the semiconductor region includes forming a semiconductor region for a perovskite solar cell on the first electrode layer arrayed first, and the first electrode layer arrayed second. The connecting portion is located in a gap between a semiconductor layer arrayed first and a semiconductor layer arrayed second in a planar manner along the first direction in the semiconductor region, and is electrically connected to the first electrode layer arrayed second. The second electrode layer is located on the semiconductor layer arrayed first and is electrically connected to the connecting portion. After the semiconductor region is formed, a part of the semiconductor region, located on the first electrode layer arrayed second, is heated to increase light transmittance of the part.

DETAILED DESCRIPTION

Figure 15:
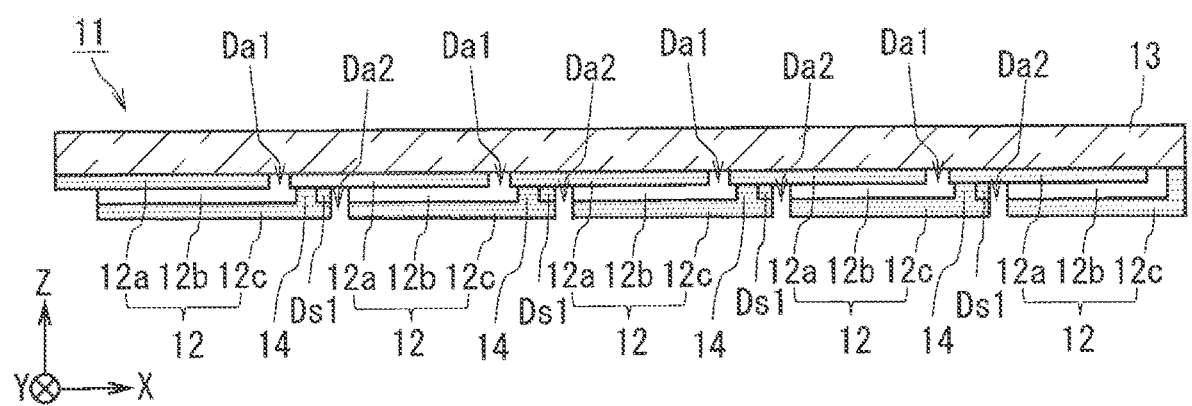
FIG. 15 is a sectional view illustrating a configuration of an example of a solar cell.

As a thin film solar cell, for example, there is adopted a solar cell 11 in which a plurality of solar cell elements 12 are arrayed on a substrate 13, as illustrated in FIG. 15. Here, each of the solar cell elements 12 has a structure in which a first electrode layer 12a, a semiconductor layer 12b having a PN junction or a PIN junction, and a second electrode layer 12c are laminated. In addition, the first electrode layer 12a and the second electrode layer 12c are electrically connected between the solar cell elements 12 adjacent to each other, so that the adjacent solar cell elements 12 are electrically connected in series. Specifically, between the adjacent solar cell elements 12, there is provided a portion (also referred to as a connecting portion) 14 for electrically connecting the first electrode layer 12a to the second electrode layer 12c, for example. In addition, between the adjacent solar cell elements 12, there are provided a region (also referred to as a first separation region) Da1 separating the first electrode layers 12a and a region (also referred to as a second separation region) Da2 separating the second electrode layers 12c, for example.

Between the connecting portion 14 and the second separation region Da2, there may be provided a part Ds1 as a dead space in which while incident light is absorbed, photoelectric conversion in accordance with this incident light cannot be performed, resulting in no contribution to power generation. In other words, the dead space can be a region that does not utilize incident light. This dead space may be formed when the second separation region Da2 is formed by scribing or the like after the first electrode layer 12a, the semiconductor layer 12b, and the second electrode layer 12c are laminated on the substrate 13, for example. Here, a dead space can be formed by forming the connecting portion 14 and the second separation region Da2 at respective positions separated from each other to prevent the connecting portion 14 from being scraped by scribing or the like, for example.

Thus, the inventors of the present disclosure have developed a technique capable of effectively utilizing incident light for a thin film solar cell.

Hereinafter, various embodiments will be described with reference to drawings. In the drawings, the same reference signs are assigned to portions having a similar configuration and function, thus, duplicated description thereof is eliminated in the following description. Each of the drawings is illustrated schematically. In each of FIGS. 1 and 2, and 4 to 14, a right handed XYZ coordinate system is added. This XYZ coordinate system includes +X direction that is a direction in which the plurality of solar cell elements 2 are arrayed, +Y direction that is a longitudinal direction of a third groove P3 located between the adjacent solar cell elements 2, and +Z direction that is a direction orthogonal to both +X direction and +Y direction.

1. First Embodiment 1-1. Solar Cell

A solar cell 1 according to a first embodiment will be described with reference to FIGS. 1 and 2.

Figure 1:
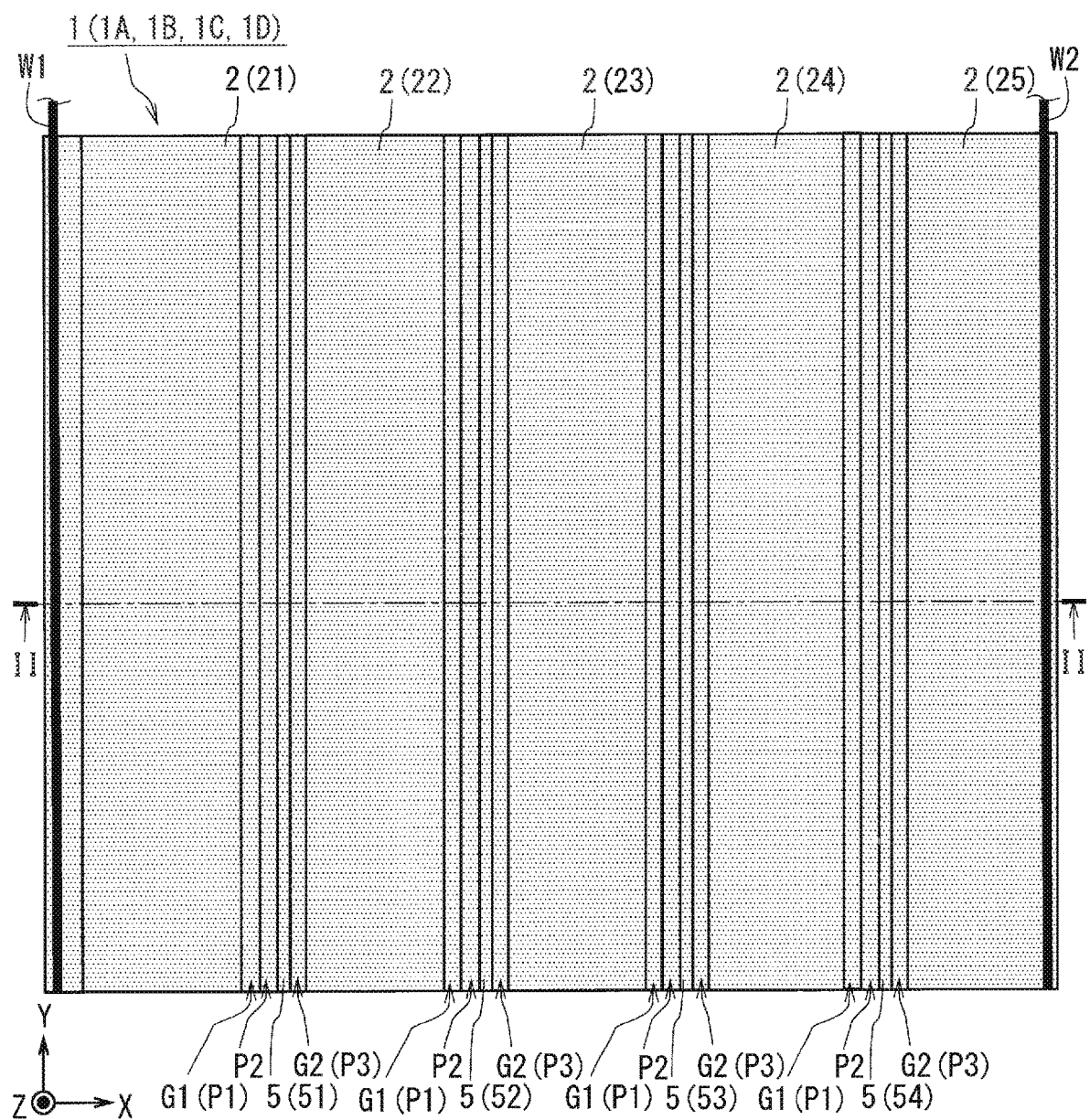
FIG. 1 is a plan view illustrating a configuration of an example of a solar cell according to a first embodiment.
Figure 2:
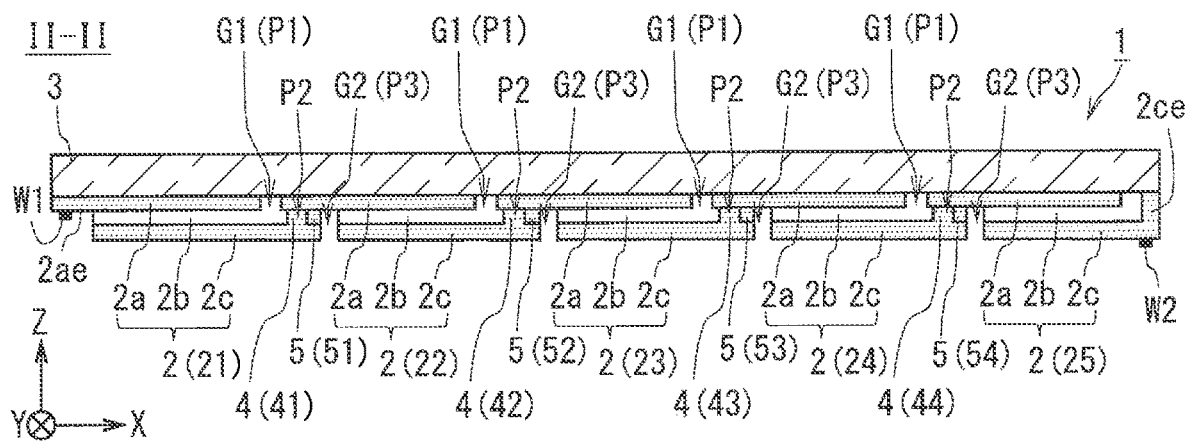
FIG. 2 is a sectional view illustrating a section of the solar cell taken along line II-II of FIG. 1.

As illustrated in FIGS. 1 and 2, the solar cell 1 includes a substrate 3, a plurality of solar cell elements 2, a connecting portion 4, and a transparent portion 5, for example. In the first embodiment, a perovskite solar cell is adopted.

The substrate 3 can support the plurality of solar cell elements 2 and protect the plurality of solar cell elements 2. When the substrate 3 has light transmittance to light having a wavelength in a specific range, light having transmitted through the substrate 3 can be incident on the plurality of solar cell elements 2, for example. As the substrate 3, a flat plate having a rectangular plate surface is adopted, for example. When a material such as glass, acrylic, or polycarbonate is adopted as a material of the substrate 3, the substrate 3 with light transmittance to light having a wavelength in a specific range can be fabricated. As the glass, a material with high light transmittance such as white sheet glass, tempered glass, and heat-ray reflective glass can be adopted, for example. In the present specification, light having a wavelength in a specific range means a wavelength in a range in which the solar cell element 2 can perform photoelectric conversion.

The plurality of solar cell elements 2 are arrayed in a planar manner along +X direction as a first direction. Here, the term, "arrayed in a planar manner", means that each of the solar cell elements 2 is located along a virtual or actual plane, and the plurality of solar cell elements 2 are arrayed. In the first embodiment, the plurality of solar cell elements 2 are arrayed on a surface of the substrate 3. More specifically, the plurality of solar cell elements 2 includes five solar cell elements 2 arrayed along the first direction (+X direction) on the substrate 3. The five solar cell elements 2 includes a first solar cell element 21, a second solar cell element 22, a third solar cell element 23, a fourth solar cell element 24, and a fifth solar cell element 25, being arrayed in order in +X direction. In other words, the plurality of solar cell elements 2 includes the n-th solar cell element $2n$ (n is a natural number of 1 to 5).

In the first embodiment, each of the solar cell elements 2 has a strip-like shape with a longitudinal direction as +Y direction. Each of the solar cell elements 2 includes a first electrode layer 2a, a semiconductor layer 2b, and a second electrode layer 2c. When at least one of the first electrode layer 2a and the second electrode layer 2c has higher light transmittance to light having a wavelength in a specific range than that of the semiconductor layer 2b, for example, incident light may pass through at least one of the first electrode layer 2a and the second electrode layer 2c in each of the solar cell elements 2. As a result, the semiconductor layer 2b can be irradiated with the incident light.

The first electrode layer 2a is located on the substrate 3. In other words, the first electrode layer 2a is located closer to the substrate 3 than the second electrode layer 2c. The first electrode layer 2a can collect electric charges generated by photoelectric conversion in accordance with light irradiation on the semiconductor layer 2b. When the substrate 3 has light transmittance, for example, the first electrode layer 2a with higher light transmittance to light having a wavelength in a specific range than that of the semiconductor layer 2b allows the light having a wavelength in the specific range to enter the semiconductor layer 2b through the substrate 3 and the first electrode layer 2a, for example. This enables fabricating the solar cell 1 in which the substrate 3 with light transmittance constitutes a front surface as a light receiving surface of the solar cell 1.

Specifically, when a transparent conductive oxide (TCO) with light transmittance to light having a wavelength in a specific range is adopted as a material of the first electrode layer 2a, the light having a wavelength in the specific range can enter the semiconductor layer 2b through the substrate 3 and the first electrode layer 2a, for example. The transparent conductive oxide may include indium tin oxide (ITO), fluorine-doped tin oxide (FTO), zinc oxide (ZnO), or the like, for example.

In the first embodiment, the five first electrode layers 2a are arrayed in a planar manner on the substrate 3 in order in +X direction. Here, the first electrode layer 2a of the m-th solar cell element $2m$ (m is a natural number of 1 to 4) and the first electrode layer 2a of the (m+1)-th solar cell element $2(m+1)$ are juxtaposed so as to sandwich a gap (referred to also as a first gap) G1. For example, the first electrode layer 2a of the first solar cell element 21 and the first electrode layer 2a of the second solar cell element 22 are juxtaposed so as to sandwich the gap (referred to also as the first gap) G1. Each first gap G1 has a longitudinal direction along +Y direction. In addition, there is provided a first groove P1 with a bottom surface formed by the substrate 3 and two side surfaces formed by respective end surfaces of the two first electrode layers 2a sandwiching the first gap G1, the end surfaces facing each other.

The semiconductor layer 2b is interposed between the first electrode layer 2a and the second electrode layer 2c. The semiconductor layer 2b of the m-th solar cell element $2m$ is located on an end portion in −X direction of the first electrode layer 2a of the (m+1)-th solar cell element 2 (m+1) adjacent in +X direction. For example, the semiconductor layer 2b of the first solar cell element 21 is located on an end portion in −X direction of the first electrode layer 2a of the second solar cell elements 22 adjacent in +X direction.

The semiconductor layer 2b has a structure in which a layer (perovskite semiconductor layer) of a semiconductor having a perovskite structure (referred to also as a perovskite semiconductor) and a hole transport layer (HTL) are laminated, for example. When the semiconductor layer 2b is a perovskite semiconductor, light having a wavelength in a specific range includes visible light and infrared light.

The perovskite semiconductor may include a halide-based organic-inorganic perovskite semiconductor, for example. The halide-based organic-inorganic perovskite semiconductor can be made of organic perovskite such as $CH_3NH_3PbI_3$, for example. The organic perovskite can be formed by applying a raw material liquid on the first electrode layer 2a located on the substrate 3 and drying it, for example. The organic perovskite is here a thin film having crystallinity. At this time, the first gap G1 is also filled with the raw material liquid, and a part of the perovskite semiconductor can be formed in the first gap G1 by drying, for example. The raw material liquid can be produced by dissolving halogenated alkylamine and lead halide that are raw materials in a solvent, for example.

The hole transporting layer (HTL) can collect and output positive holes. As a material of the hole transporting layer (HTL), Spiro-OMeTAD that is a soluble diamine derivative or the like is adopted, for example.

When the perovskite semiconductor is an intrinsic semiconductor (i-type semiconductor), the hole transport layer is a p-type semiconductor, and the TCO constituting the first electrode layer 2a is an n-type semiconductor, for example, a PIN junction region can be formed. In the PIN junction region, power generation can be performed by photoelectric conversion in accordance with light irradiation. In the semiconductor layer 2b, a layer of an n-type semiconductor may be interposed between the perovskite semiconductor layer and the first electrode layer 2a, for example. At this time, the PIN junction region can be formed only in the semiconductor layer 2b.

The second electrode layer 2c is located on the semiconductor layer 2b. The second electrode layer 2c can collect electric charges generated by photoelectric conversion in accordance with light irradiation on the semiconductor layer 2b. When the second electrode layer 2c has higher light transmittance to light having a wavelength in a specific range than that of the semiconductor layer 2b, for example, light incident from a side opposite to the substrate 3 may enter the semiconductor layer 2b by passing through the second electrode layer 2c, for example. This enables fabricating the solar cell 1 with both surfaces in ±Z direction that are each a light receiving surface. As a result, incident light to the solar cell 1 can be effectively used.

Specifically, when a transparent conductive oxide (TCO) with light transmittance to light having a wavelength in a specific range is adopted as a material of the second electrode layer 2c, for example, the light having a wavelength in the specific range can enter the semiconductor layer 2b through the second electrode layer 2c. The transparent conductive oxide may include indium tin oxide (ITO), fluorine-doped tin oxide (FTO), zinc oxide (ZnO), or the like, for example.

In the first embodiment, the five second electrode layers 2c are arrayed in order in +X direction in a planar manner.

Here, the second electrode layer 2c of the m-th solar cell element 2m and the second electrode layer 2c of the (m+1)-th solar cell element 2 (m+1) are juxtaposed so as to sandwich a gap (referred to also as a second gap) G2. For example, the second electrode layer 2c of the first solar cell element 21 and the second electrode layer 2c of the second solar cell element 22 are juxtaposed so as to sandwich the gap (second gap) G2. Each second gap G2 has a longitudinal direction along +Y direction, for example. In addition, a third groove P3 with a bottom surface formed by the first electrode layer 2a is formed. In each of the solar cell elements 2, the second electrode layer 2c extends more in the +X direction than the first electrode layer 2a. In other words, the second gap G2 is provided at a position shifted in the first direction (+X direction) from the first gap G1.

The connecting portion 4 electrically connects two adjacent solar cell elements 2 among the plurality of solar cell elements 2 in series. In the first embodiment, the m-th connecting portion 4m electrically connects the m-th solar cell element 2m to the (m+1)-th solar cell element 2 (m+1). For example, the first connecting portion 41 electrically connects the first solar cell element 21 to the second solar cell element 22. More specifically, the m-th connecting portion 4m electrically connects the second electrode layer 2c of the m-th solar cell element 2m to the first electrode layer 2a of the (m+1)-th solar cell element 2 (m+1). For example, the first connecting portion 41 electrically connects the second electrode layer 2c of the first solar cell element 21 to the first electrode layer 2a of the second solar cell element 22. This enables the plurality of solar cell elements 2 to be electrically connected in series.

The connecting portion 4 is located between the semiconductor layer 2b and the transparent portion 5 in +X direction. In other words, there is provided a second groove P2 having side surfaces formed by the corresponding one of an end surface in +X direction of the semiconductor layer 2b and an end surface in −X direction of the transparent portion 5, and a bottom surface formed by a surface of the first electrode layer 2a in −Z direction. The second groove P2 has a longitudinal direction along +Y direction. Then, the connecting portion 4 is filled in the second groove P2, for example.

The transparent portion 5 has higher light transmittance to light having a wavelength in a specific range than that of the semiconductor layer 2b. The transparent portion 5 can be formed by locally heating a part of the perovskite semiconductor layer, for example.

In the first embodiment, the m-th transparent portion 5m is located between the m-th connecting portion 4m of the m-th solar cell element 2m and the (m+1)-th solar cell element 2 (m+1). For example, the first transparent portion 51 is located between the first connecting portion 41 of the first solar cell element 21 and the second solar cell element 22. More specifically, the m-th transparent portion 5m is provided at a position shifted in the first direction (+X direction) from the m-th connecting portion 4m, between the second electrode layer 2c of the m-th solar cell element 2m and the first electrode layer 2a of the (m+1)-th solar cell element 2 (m+1). For example, the first transparent portion 51 is provided at a position shifted in the first direction (+X direction) from the first connecting portion 41, between the second electrode layer 2c of the first solar cell element 21 and the first electrode layer 2a of the second solar cell element 22. Providing the transparent portion 5 as described above enables reducing a dead space in which while incident light is absorbed, photoelectric conversion in accordance with this incident light cannot be performed, resulting in no contribution to power generation, for example. As a result, incident light can be effectively used.

In the first solar cell element 21, the first electrode layer 2a includes a portion (referred to also as a first extension) 2ae extending in −X direction from the semiconductor layer 2b and the second electrode layer 2c. In the fifth solar cell element 25, the semiconductor layer 2b and the second electrode layer 2c extend in +X direction from the first electrode layer 2a. In addition, there is provided a portion (referred to also as a second extension) 2ce that extends in +X direction from the first electrode layer 2a and the semiconductor layer 2b. Onto the first extension 2ae, a first conductor W1 for output of a first polarity is electrically connected. Onto the second extension 2ce, a second conductor W2 for output of a second polarity is electrically connected. For example, when the first polarity is a negative polarity, the second polarity is a positive polarity. For example, when the first polarity is a positive polarity, the second polarity is a negative polarity.

1-2. Method for Manufacturing Solar Cell

Next, a method for manufacturing a solar cell 1 will be described with reference to FIGS. 3 to 10.

Figure 3:
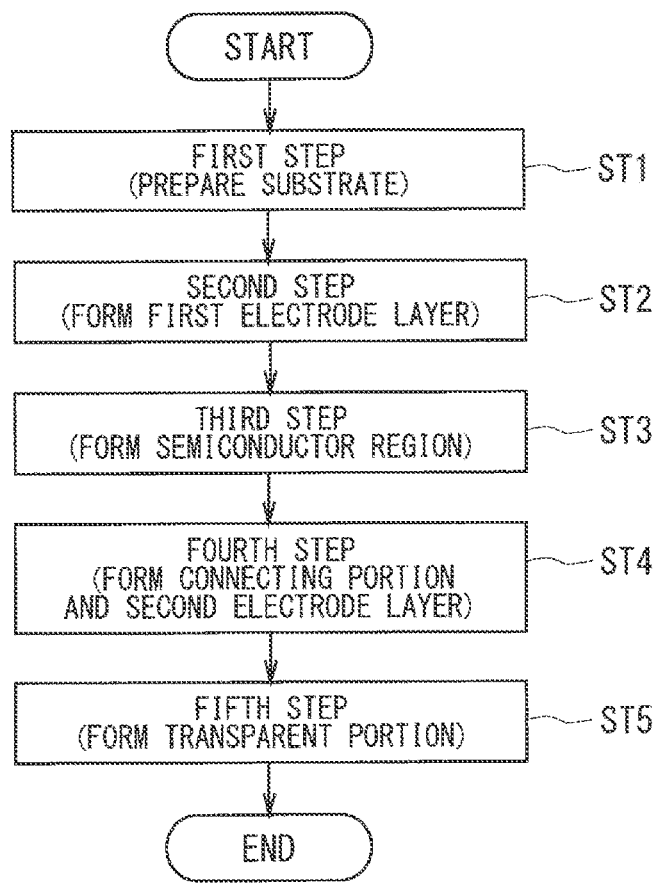
FIG. 3 is a flowchart illustrating a flow according to an example of a method for manufacturing a solar cell.

As illustrated in FIG. 3, the solar cell 1 can be manufactured by performing first step ST1 to fifth step ST5 in this order, for example.

Figure 4:
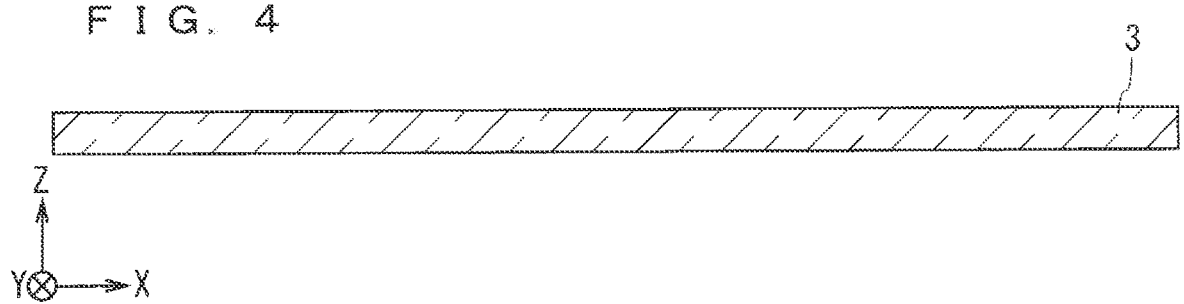
FIG. 4 is a sectional view illustrating an example of an intermediate state of manufacturing of a solar cell.

In first step ST1, a substrate 3 is prepared as illustrated in FIG. 4, for example. As the substrate 3, a flat plate with light transmittance to light having a wavelength in a specific range and with a rectangular plate surface is adopted, for example.

In second step ST2, a plurality of first electrode layers 2a arrayed in the first direction (+X direction) in a planar manner is formed on a surface of the substrate 3.

Figure 5:
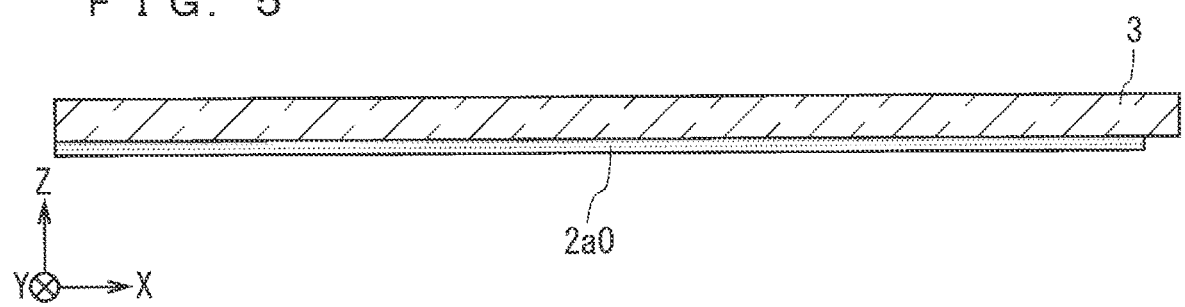
FIG. 5 is a sectional view illustrating an example of an intermediate state of the manufacturing of a solar cell.

As illustrated in FIG. 5, an electrode layer 2a0 is first formed on one plate surface of the substrate 3. The electrode layer 2a0 can be formed by sputtering or vapor deposition, for example. The electrode layer 2a0 can be made of a transparent conductive oxide such as ITO, FTO, or ZnO, for example. At this time, the electrode layer 2a0 may be set to have a thickness of about 10 nm to 1000 nm, for example.

Figure 6:
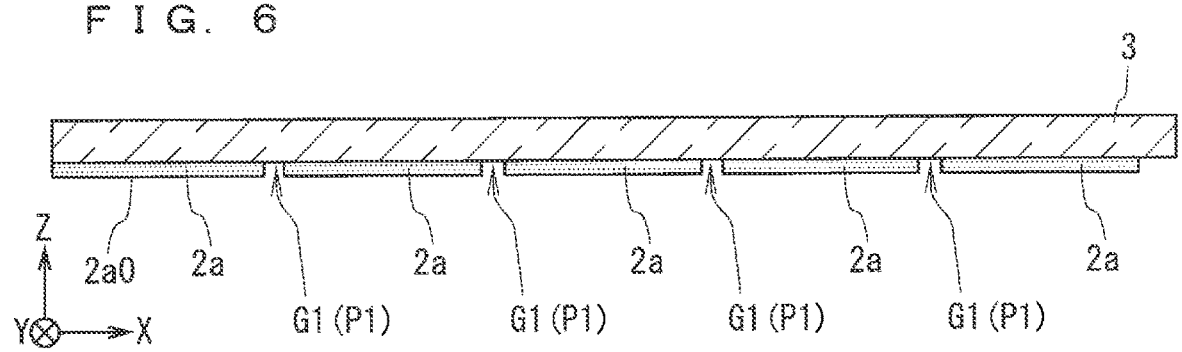
FIG. 6 is a sectional view illustrating an example of an intermediate state of the manufacturing of a solar cell.

Next, the electrode layer 2a0 is separated into a plurality of first electrode layers 2a as illustrated in FIG. 6. For example, the plurality of first electrode layers 2a is formed by forming a plurality of first grooves P1 (first gaps G1). This forms first to fifth first electrode layers 2a arrayed in the first direction (+X direction) in a planar manner on the surface of the substrate 3, for example. The plurality of first grooves P1 (first gaps G1) can be formed by irradiating a region of a desired pattern in the electrode layer 2a0 with a laser, for example. Each of the first grooves P1 (each of the first gaps G1) can be formed so as to have a longitudinal direction as +Y direction. Each of the first grooves P1 (each of the first gaps G1) is set to have a width of about 30 μm to 300 μm, for example. In addition, each of the first electrode layers 2a is set to have a width of about 1 mm to 10 mm in the first direction (+X direction), for example. The first groove P1 (first gap G1) may be formed by scribing, for example.

Figure 7:
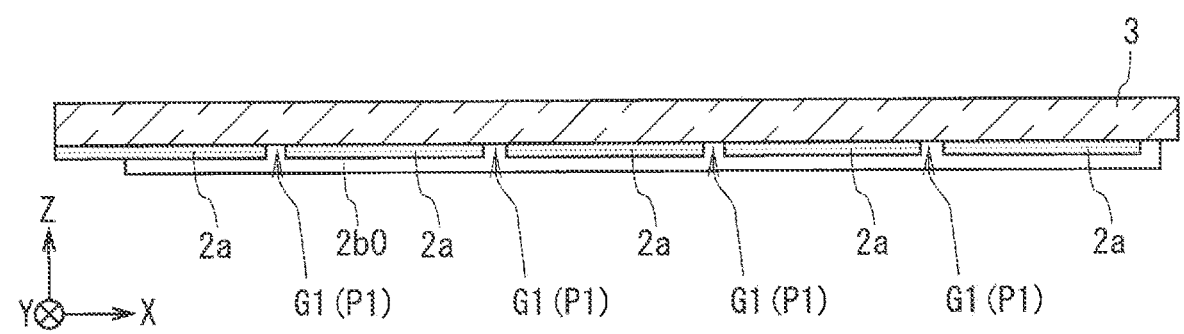
FIG. 7 is a sectional view illustrating an example of an intermediate state of the manufacturing of a solar cell.

In third step ST3, a semiconductor region 2b0 for a perovskite solar cell is formed on each of the first electrode layers 2a as illustrated in FIG. 7. For example, the plurality of first electrode layers 2a includes the first electrode layers 2a arrayed first to fifth.

The semiconductor region 2b0 can be formed by coating and drying a raw material liquid, for example. The semiconductor region 2b0 has a structure in which a plurality of layers including a perovskite semiconductor layer and a hole transport layer are laminated. In this case, after the perovskite semiconductor layer is formed by applying and drying a first raw material liquid, the hole transport layer can be formed on the perovskite semiconductor layer by coating and drying a second raw material liquid, for example. At this time, the semiconductor region 2b0 may be set to have a thickness of about 100 nm to 2000 nm, for example.

Figure 8:
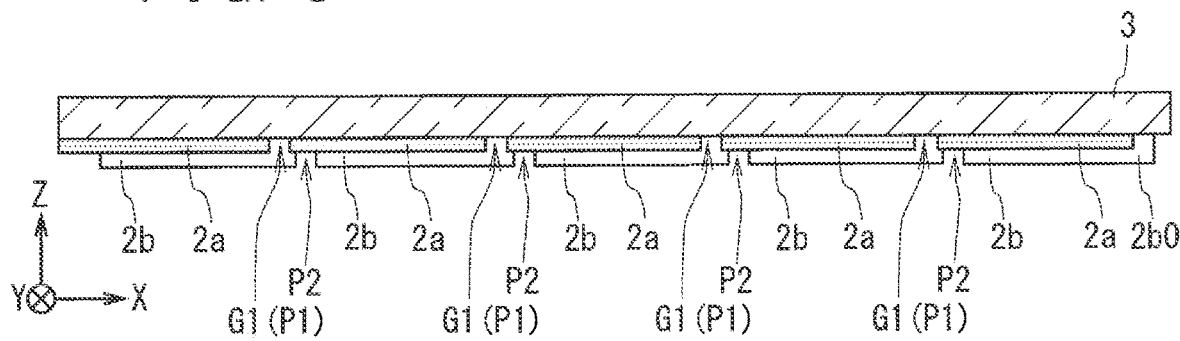
FIG. 8 is a sectional view illustrating an example of an intermediate state of the manufacturing of a solar cell.

At this time, the semiconductor region 2b0 also enters the plurality of first grooves P1 (first gaps G1). In the first embodiment, the semiconductor region 2b0 is separated into a plurality of semiconductor layers 2b, as illustrated in FIG. 8. For example, forming a plurality of second grooves P2 forms a plurality of semiconductor layers 2b. This forms the semiconductor layers 2b arrayed first to fifth in the first direction (+X direction) in a planar manner on the plurality of first electrode layers 2a, for example. In the first direction (+X direction), the m-th second groove P2 can be formed by scribing or the like in a region of a desired pattern at a position shifted in the +X direction from the m-th first groove P1 in the semiconductor region 2b0. At this time, the m-th second groove P2 is formed so as to be separated from the m-th first groove P1 in +X direction by about 10 μm to 100 μm, for example. Each of the second grooves P2 can be formed so as to have a longitudinal direction as +Y direction. Then, each of the second grooves P2 is set to have a width of about 30 μm to 300 μm, for example.

In fourth step ST4, a connecting portion 4 and a second electrode layer 2c are formed.

Figure 9:
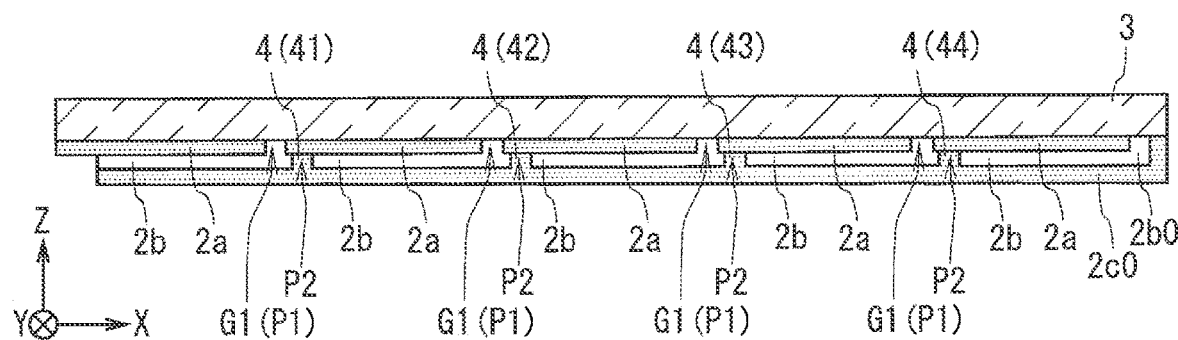
FIG. 9 is a sectional view illustrating an example of an intermediate state of the manufacturing of a solar cell.

As illustrated in FIG. 9, an electrode layer 2c0 is first formed on the semiconductor region 2b0. The electrode layer 2c0 can be formed by sputtering, vapor deposition, or the like, for example. The electrode layer 2c0 can be made of a transparent conductive oxide such as ITO, FTO, or ZnO, for example. The electrode layer 2c0 can be set to have a thickness of about 10 nm to 1000 nm, for example. At this time, the electrode layer 2c0 enters each of the second grooves P2 in the semiconductor region 2b0. This forms a first connecting portion 41, a second connecting portion 42, a third connecting portion 43, and a fourth connecting portion 44. In other words, there is formed the m-th connecting portion 4m located at a gap (second groove P2) between the m-th semiconductor layer 2b and the (m+1)-th semiconductor layer 2b in the first direction (+X direction) in the semiconductor region 2b0. At this time, the m-th connecting portion 4m is electrically connected to the (m+1)-th first electrode layer 2a. For example, the first connecting portion 41 is electrically connected to the first electrode layer 2a arrayed second.

Figure 10:
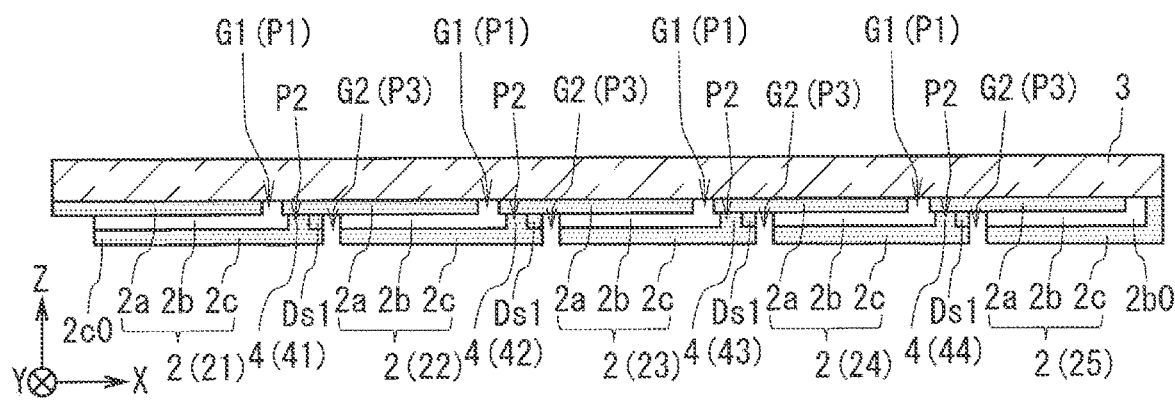
FIG. 10 is a sectional view illustrating an example of an intermediate state of the manufacturing of a solar cell.

Next, the electrode layer 2c0 is separated into a plurality of second electrode layers 2c as illustrated in FIG. 10. For example, the plurality of second electrode layers 2c is formed by forming a plurality of third grooves P3 (second gaps G2). This forms the first to fifth second electrode layers 2c arrayed along the first direction (+X direction) in a planar manner on the first to fifth semiconductor layers 2b arrayed along the first direction (+X direction) in a planar manner, for example. Specifically, the m-th second electrode layer 2c is located on the m-th semiconductor layer 2b. For example, the first second electrode layer 2c is located on the first semiconductor layer 2b. Then, the m-th second electrode layer 2c is electrically connected to the m-th connecting portion 4m. For example, the first second electrode layer 2c is electrically connected to the first connecting portion 41.

Here, the m-th third groove P3 (second gap G2) can be formed by scribing or the like in a region of a desired pattern at a position shifted in +X direction from the m-th second groove P2 in the semiconductor region 2b0, for example. At this time, the m-th third groove P3 is formed so as to be separated from the m-th second groove P2 in +X direction by about 10 μm to 100 μm, for example. Each of the third grooves P3 (each of the second gaps G2) is set to have a width of about 10 μm to 100 μm, for example. As a result, each of the second electrode layers 2c has a width of about 1 mm to 10 mm in the first direction (+X direction), for example. Then, the m-th third groove P3 (second gap G2) in the first direction (+X direction) is located at a position shifted in the first direction (+X direction) from the m-th first gap G1 and the m-th connecting portion 4m in the first direction (+X direction). At this time, an m-th part Ds1 to be a dead space of the semiconductor region 2b0 can be formed between the m-th connecting portion 4m and the m-th third groove P3 (second gap G2). In this case, the m-th second electrode layer 2c is located from a portion on the m-th semiconductor layer 2b to a portion on the m-th part Ds1.

In fifth step ST5, the part Ds1 to be a dead space of the semiconductor region 2b0 is heated to form a transparent portion 5 having enhanced light transmittance to light having a wavelength in a specific range in the part Ds1. Here, the m-th part Ds1 located on the (m+1)-th first electrode layer 2a in the semiconductor region 2b0 is heated to form the transparent portion 5 with the m-th part that has higher light transmittance to light having a wavelength in the specific range than that of the semiconductor region 2b0, for example. The heating of the part Ds1 can be performed by local laser irradiation, for example.

In this case, a band gap of a perovskite semiconductor constituting the part Ds1 is increased by being heated at a relatively low temperature of 100° C. to 200° C. with a laser, for example. As a result, the perovskite semiconductor can be changed to a wide-gap semiconductor that has higher light transmittance to light having a wavelength in the specific range than that of the original perovskite semiconductor. As a material of a perovskite semiconductor with light transmittance to light having a wavelength in a specific range to be improved in accordance with heating as described above, a material of a perovskite semiconductor having a Pb—I bond such as $CH_3NH_3PbI_3$, $CsPbI_3$, and $NH_2CHNH_2PbI_3$ is conceivable, for example. It is conceivable that the Pb—I bond of the perovskite semiconductor is changed in state due to structural change by heating to increase the band gap. In addition, a hole transport layer constituting the part Ds1 can be made of a material with high light transmittance to light having a wavelength in a specific range. This enables the part Ds1 serving as a dead space to be made transparent by heating at a relatively low temperature with small energy applied.

Specifically, a compound having a perovskite type crystal structure or a crystal structure similar to this crystal structure is represented by the general formula such as $ABX_3$, $A_2BX_4$, $AB'X_4$, and $A'BX_4$. Here, A represents a monovalent cation such as $CH_3NH_3^+$, $CH(NH_2)_2^+$, and $Cs^+$. A' and B each represents divalent a cation such as $Pb^{2+}$, and $Sn^{2+}$. B' represents a trivalent cation such as $Bi^{3+}$, and $Sb^{3+}$. X represents a monovalent anion such as $Cl^-$, $Br^-$, and $I^-$.

Then, these compounds generate decomposition according to reaction formulas (1) to (4) by heating, for example.

$$ABX_3 \rightarrow AX + BX_2 \quad (1)$$

$$A_2BX_4 \rightarrow 2AX + BX_2 \quad (2)$$

$$AB'X_4 \rightarrow AX + B'X_3 \quad (3)$$

$$A'BX_4 \rightarrow A'X_2 + BX_2 \quad (4)$$

When a perovskite semiconductor is made transparent by laser irradiation, the laser is set to have an output of about 0.1 W to 1 W, for example. A laser beam is set to have a wavelength of light of about 400 nm to 700 nm, for example. The laser beam is set to have a diameter of light flux of about 40 μm, for example. The laser beam is set to have a scanning speed of 1200 mm/sec, for example. Light having a wavelength of 400 nm to 700 nm is not absorbed by a TCO and can be absorbed by a perovskite semiconductor. This enables the perovskite semiconductor to be locally heated.

Forming the transparent portion 5 as described above enables reducing a dead space in which while incident light is absorbed, photoelectric conversion in accordance with this incident light cannot be performed, resulting in no contribution to power generation, for example. As a result, incident light can be effectively used.

1-3. Summary of First Embodiment

In the solar cell 1 according to the first embodiment, providing the transparent portion 5 enables reducing a dead space in which while incident light is absorbed, photoelectric conversion in accordance with this incident light cannot be performed, resulting in no contribution to power generation, for example. As a result, incident light can be effectively used.

For example, when the transparent portion 5 provided reduces the dead space, a part of the incident light lost due to existence of the dead space can be easily emitted from a back surface of the solar cell 1, being a non-light receiving surface. This enables a see-through solar cell with much transmitted light and excellent appearance to be fabricated, for example.

2. Other Embodiments

The present disclosure is not limited to the first embodiment described above, and various modifications and improvements are possible without departing from the essence of the present disclosure.

2-1. Second Embodiment

Figure 11:
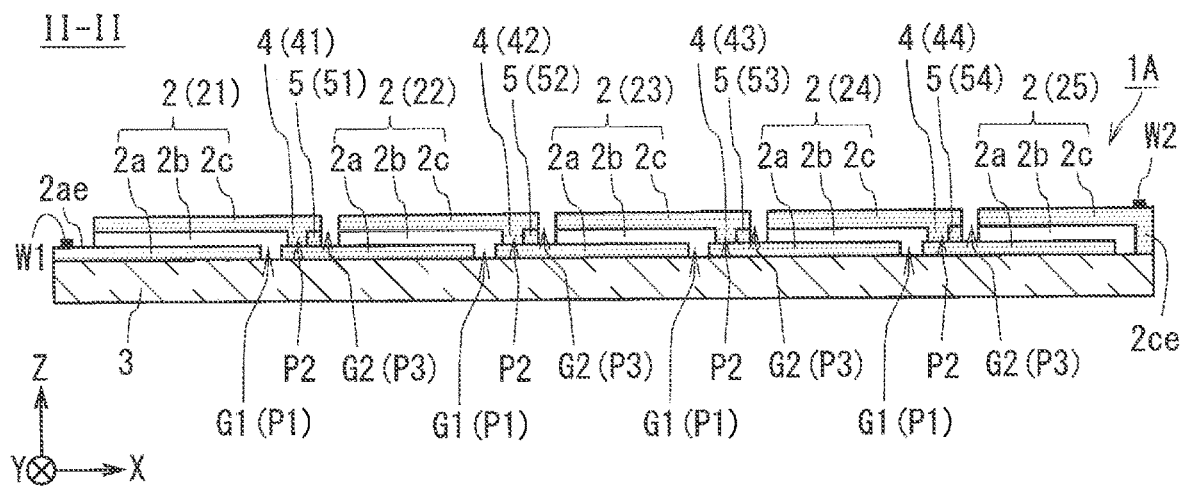
FIG. 11 is a sectional view illustrating a section of an example of a solar cell according to a second embodiment.

In the first embodiment above, the substrate 3 may be located not on a front surface side but on a back surface side, as illustrated in FIG. 11, for example. A solar cell 1A according to the second embodiment illustrated in FIG. 11 has an upside-down structure of the solar cell 1 according to the first embodiment illustrated in FIG. 2.

The solar cell 1A according to the second embodiment here includes a substrate 3, for example. Here, a plurality of solar cell elements 2 are arrayed on the substrate 3 along a surface thereof. A first electrode layer 2a is located closer to the substrate 3 than a second electrode layer 2c. The second electrode layer 2c has higher light transmittance to light having a wavelength in a specific range than that of the semiconductor layer 2b. When structure as described above is adopted, incident light can be effectively used in the solar cell 1A with a front surface as a light receiving surface, on an opposite side of the substrate 3, for example.

2-2. Third Embodiment

In each of the first and second embodiments described above, there may be provided a reflecting portion for reflecting light having a wavelength in a specific range that has passed through the transparent portion 5 to enable the light to enter the semiconductor layer 2b, for example. In other words, there may be provided a reflecting portion capable of reflecting light having a wavelength in a specific range that has passed through the transparent portion 5, on a virtual straight line passing through a part of a first electrode layer 2a and a part of a second electrode layer 2c located so as to sandwich the transparent portion 5. When structure as described above is adopted, light having passed through the transparent portion 5 can be reflected by the reflecting portion to enable the light to enter the semiconductor layer 2b, for example. At this time, the light reflected by the reflecting portion can be used for photoelectric conversion in the semiconductor layer 2b. As a result, incident light can be effectively used.

For example, when a metal without light transmittance to light having a wavelength in a specific range is adopted as the material of the second electrode layer 2c in the first embodiment, the second electrode layer 2c can serve as an electrode layer (referred to also as a metal electrode layer) as a reflecting portion capable of reflecting light having a wavelength in a specific range, having passed through the transparent portion 5. In addition, for example, when a metal without light transmittance to light having a wavelength in a specific range is adopted as the material of the first electrode layer 2a in the second embodiment, the first electrode layer 2a can serve as a metal electrode layer as a reflecting portion capable of reflecting light having a wavelength in the specific range, having passed through the transparent portion 5. In other words, it is conceivable that one of the first electrode layer 2a and the second electrode layer 2c may be a metal electrode layer capable of reflecting light having a wavelength in the specific range that has passed through the transparent portion 5.

As a material of the metal electrode layer, a metal material excellent in conductivity and light reflection characteristics, such as aluminum, can be adopted, for example. In this case, at least a part of light having a wavelength in a specific range that has passed through the transparent portion 5 can be reflected by a surface of the metal electrode layer to enable the light to enter the semiconductor layer 2b, for example. At this time, the light reflected by the metal electrode layer can be used for photoelectric conversion in the semiconductor layer 2b, for example. As a result, incident light to the solar cells 1 and 1A can be effectively used. In addition, the structure of reflecting light having passed through the transparent portion 5 to allow the light to enter the semiconductor layer 2b does not become a large scale and can be easily fabricated, for example.

Figure 12:
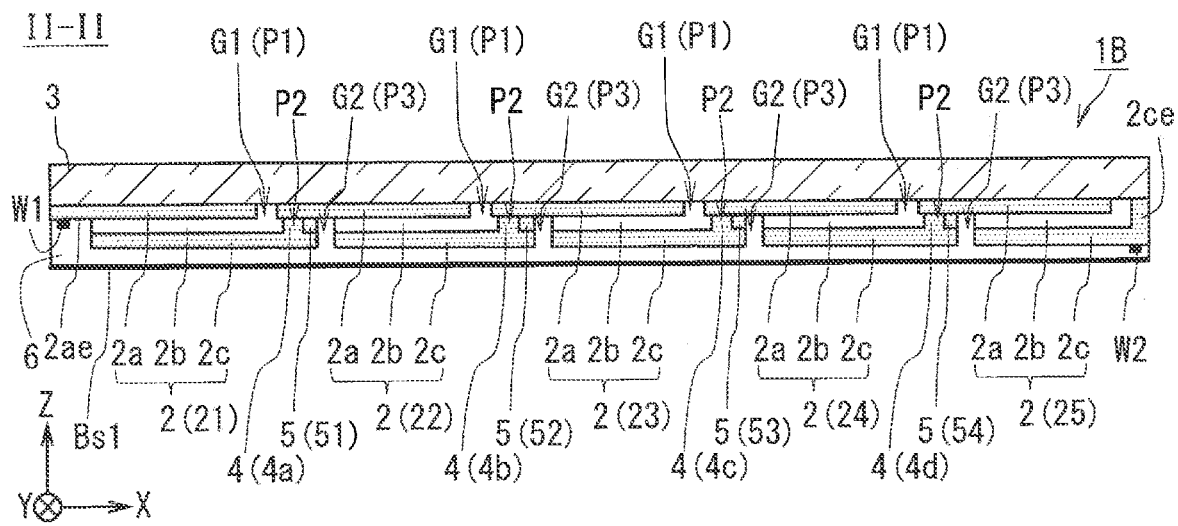
FIG. 12 is a sectional view illustrating a section of an example of a solar cell according to a third embodiment.

For example, when the second electrode layer 2c has higher light transmittance to light having a wavelength in a specific range than that of the semiconductor layer 2b in the first embodiment, a reflecting portion for reflecting light may be added on a back surface side as a non-receiving surface. As illustrated in FIG. 12, there may be adopted a solar cell 1B to which a reflecting portion Bs1 capable of scattering light by diffusely reflecting light, such as a white back sheet, is added, for example. At this time, it is sufficient that the reflecting portion Bs1 is supported by a sealing material 6 such as ethylene vinyl acetate copolymer (EVA), for example. Structure as described above allows a part of incident light that is previously lost due to existence of a dead space to pass through the transparent portion 5 in accordance with decrease in the dead space. Then, light having passed through the transparent portion 5 can be reflected by the reflecting portion Bs1 to enter the semiconductor layer 2b, for example. At this time, the light can be absorbed in a region on a back surface side of the semiconductor layer 2b in the solar cell 1. A part of the light absorbed here can be used for photoelectric conversion. As a result, incident light can be effectively used.

Figure 13:
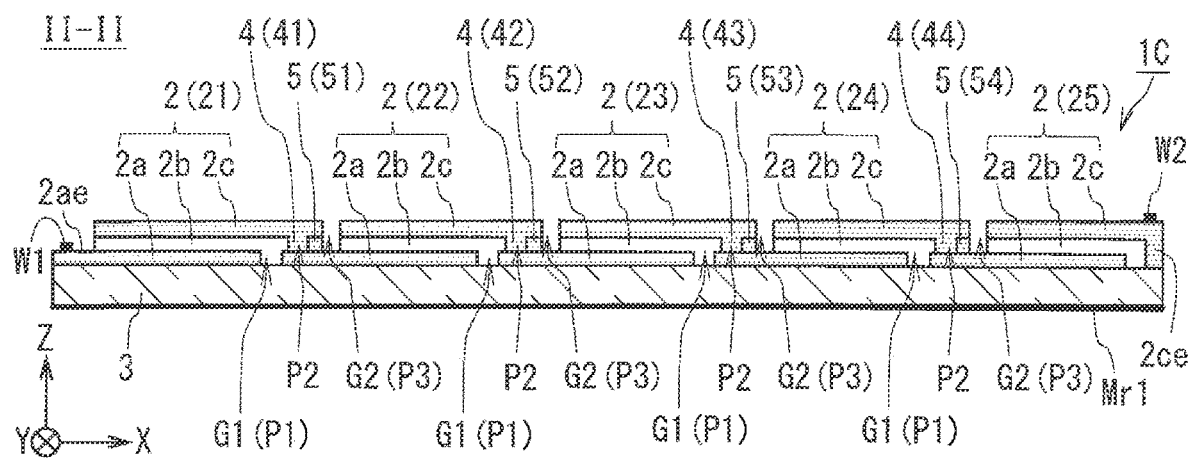
FIG. 13 is a sectional view illustrating a section of an example of a solar cell according to a fourth embodiment.

As illustrated in FIG. 13, there may be adopted a solar cell 1C where the substrate 3 includes a portion (referred to also as a reflecting portion) Mr1 that reflects light against light irradiation from a +Z side in the second embodiment above, for example. Structure as described above allows a part of incident light that is previously lost due to existence of a dead space to pass through the transparent portion 5 in accordance with decrease in the dead space. Then, light having passed through the transparent portion 5 is reflected by the reflecting portion Mr1 to enable the light to be absorbed in a region on the back surface side of the semiconductor layer 2b in the solar cell 1. A part of the incident light absorbed here can be used for photoelectric conversion. As a result, incident light can be effectively used.

2-3. Fourth Embodiment

Figure 14:
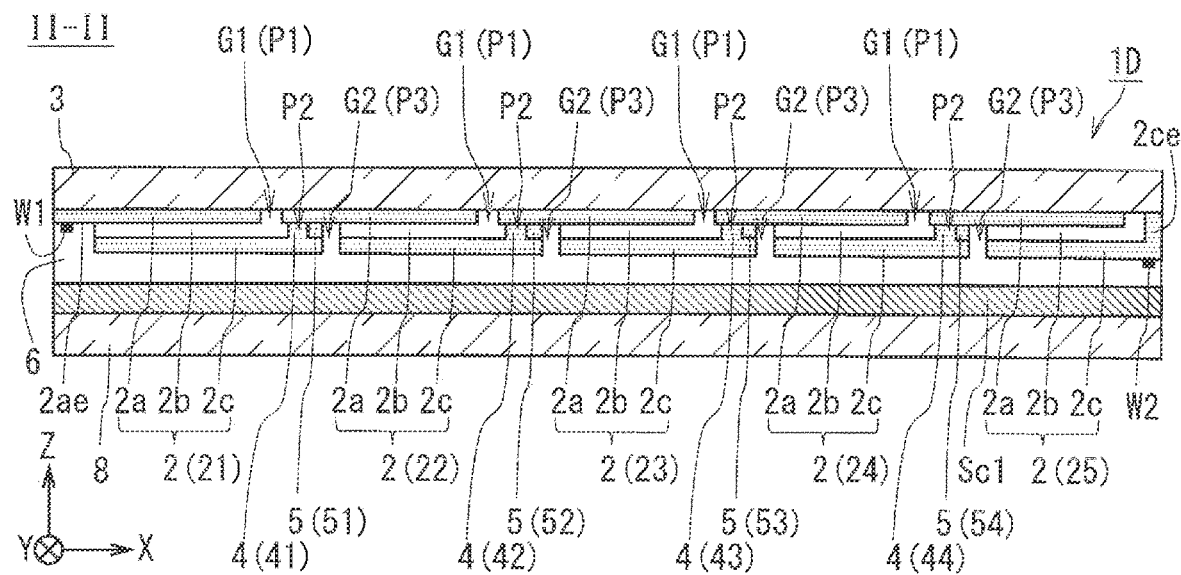
FIG. 14 is a sectional view illustrating a section of an example of a solar cell according to a fifth embodiment.

In each of the first and second embodiments, there may be provided one or more kinds of another solar cell element Sc1 different from the plurality of solar cell elements 2 to receive light having passed through the plurality of solar cell elements 2 arrayed in a planar manner, for example. As illustrated in FIG. 14, there may be adopted a solar cell 1D including one or more kinds of another solar cell element Sc1 different from the plurality of solar cell elements 2 on a virtual straight line passing through a part of a first electrode layer 2a and a part of a second electrode layer 2c located so as to sandwich a transparent portion 5, for example. In this case, in each of the first electrode layer 2a and the second electrode layer 2c, it is sufficient that light transmittance to light having a wavelength in a specific range is higher than that of a semiconductor layer 2b, for example. For example, it is sufficient that the first electrode layer 2a and the second electrode layer 2c are made of a material such as a TCO having higher light transmittance to light having a wavelength in a specific range than that of the semiconductor layer 2b.

Here, the plurality of solar cell elements 2 as top cells absorbs visible light and near infrared light to use the light for photoelectric conversion, for example. In this case, it is conceivable that another solar cell element Sc1 constituting a bottom cell may absorb infrared light having a longer wavelength than that of near infrared light to use the light for photoelectric conversion, for example. As the other solar cell element Sc1, a solar cell element having a semiconductor layer made of silicon crystal is conceivable, for example.

When the solar cell 1D above of a tandem type is adopted, light having passed through the transparent portion 5 can be used for photoelectric conversion in another solar cell element Sc1, thereby enabling increase in the amount of power generation due to effective use of incident light, for example. As a result, conversion efficiency may increase.

3. Others

In each of the first embodiment, the second embodiment, the third embodiment, and the fourth embodiment, described above, the part Ds1 of the semiconductor region 2b0 or a part corresponding to the part Ds1 may be made transparent by heating at certain timing after the semiconductor region 2b0 is formed, for example. When the part Ds1 of the semiconductor region 2b0 is made transparent by heating after the third groove P3 is formed in the semiconductor region 2b0, for example, the semiconductor layer 2b constituting the solar cell element 2 is less likely to deteriorate.

In each of the first embodiment, the second embodiment, the third embodiment, and the fourth embodiment, described above, the part Ds1 of the semiconductor region 2b0 may be heated by irradiation with infrared light in the shape of a slit, contact with a heated wire or a member in the shape of a blade, or the like, instead of irradiation with a laser beam, for example.

In each of the first embodiment, the second embodiment, the third embodiment, and the fourth embodiment, described above, the plurality of second electrode layers 2c each may be formed in a form in which the third groove P3 (second gap G2) is previously formed by patterning with vapor deposition or the like using a mask or the like, for example. In this case, the third grooves P3 (second gap G2) only needs to separate the plurality of second electrode layers 2c from each other, and may not reach the semiconductor region 2b0, for example. This enables a step of scribing the electrode layer 2c0 and the semiconductor region 2b0 to be eliminated, for example.

In each of the first embodiment, the second embodiment, the third embodiment, and the fourth embodiment, described above, the plurality of semiconductor layers 2b each may be formed in a form in which the second groove P2 is previously formed by patterning with a coating method or the like using a mask or the like, for example. In this case, a step of forming the second groove P2 with scribing or the like after the semiconductor region 2b0 is formed can be eliminated.

In the solar cells 1, 1A, 1B, 1C, and 1D according to the corresponding first to fourth embodiments, six or more solar cell elements 2 may be arrayed in a planar manner, or two or more and four or less solar cell elements 2 may be arrayed in a planar manner, for example.

It is needless to say that all or a part of each of the embodiments described above can be combined as appropriate within a consistent range.

The invention claimed is:

1. A solar cell comprising:
   a plurality of solar cell elements that are arrayed in a planar manner along a first direction, and include a first solar cell element and a second solar cell element that are adjacent to each other;
   a connecting portion that electrically connects the first solar cell element to the second solar cell element; and
   a transparent portion that is located between the connecting portion and the second solar cell element, wherein
   each one of the plurality of solar cell elements includes a first electrode layer, a second electrode layer, and a semiconductor layer interposed between the first electrode layer and the second electrode layer,
   the first electrode layer of the first solar cell element and the first electrode layer of the second solar cell element are juxtaposed so as to sandwich a first gap,
   the second electrode layer of the first solar cell element and the second electrode layer of the second solar cell element are juxtaposed so as to sandwich a second gap,
   the second gap is provided at a position shifted in the first direction from the first gap,
   the connecting portion electrically connects the second electrode layer of the first solar cell element to the first electrode layer of the second solar cell element,
   the transparent portion is provided between the second electrode layer of the first solar cell element and the first electrode layer of the second solar cell element in an entirety of an area between the connecting portion and the second gap at a position shifted in the first direction from the connecting portion, and has higher light transmittance than that of the semiconductor layer,
   at least one of the first electrode layer and the second electrode layer has higher light transmittance than that of the semiconductor layer,
   the transparent portion includes a layer formed by heating a part of a semiconductor region including the same semiconductor material as the semiconductor layer, and
   the second gap has a bottom surface formed by the first electrode layer of the second solar cell element.

2. The solar cell according to claim 1, further comprising a substrate with light transmittance, wherein
   the plurality of solar cell elements are arrayed on the substrate along a surface of the substrate, and
   the first electrode layer is located closer to the substrate than the second electrode layer and has higher light transmittance than that of the first semiconductor layer.

3. The solar cell according to claim 1, further comprising a substrate, wherein
   the plurality of solar cell elements are arrayed on the substrate along a surface of the substrate,
   the first electrode layer is located closer to the substrate than the second electrode layer, and
   the second electrode layer has higher light transmittance than that of the semiconductor layer.

4. The solar cell according to claim 1, further comprising one or more kinds of solar cell element different from the plurality of solar cell elements that is provided on a virtual straight line passing through a part of the first electrode layer and a part of the second electrode layer located so as to sandwich the transparent portion, wherein
   each of the first electrode layer and the second electrode layer has higher light transmittance than that of the semiconductor layer.

5. The solar cell according to claim 1, further comprising a reflection portion capable of reflecting light having passed through the transparent portion that is provided on a virtual straight line passing through a part of the first electrode layer and a part of the second electrode layer located so as to sandwich the transparent portion.

6. The solar cell according to claim 1 wherein any one of the first electrode layer and the second electrode layer includes a metal electrode layer capable of reflecting light having passed through the transparent portion.

7. The solar cell according to claim 1, wherein the transparent portion includes a layer formed by heating a part of a perovskite semiconductor layer.

8. A method for manufacturing the solar cell according to claim 1, the method comprising:
   preparing a substrate;
   forming the first electrode layer of the first solar cell element, and the first electrode layer of the second solar cell element, on a surface of the substrate along the first direction in a planar manner;
   forming a semiconductor region for a perovskite solar cell on the first electrode layer of the first solar cell element, and the first electrode layer of the second solar cell element; and
   forming the connecting portion located in a gap between the semiconductor layer of the first solar cell element and the semiconductor layer of the second solar cell element in a planar manner along the first direction in the semiconductor region while being electrically connected to the first electrode layer of the second solar cell element, and the second electrode layer located on the semiconductor layer of the first solar cell element while being electrically connected to the connecting portion, wherein a part of the semiconductor region, located on the first electrode layer of the second solar cell element is heated, after the semiconductor region is formed, to increase light transmittance of the part and thereby form the transparent portion.

\* \* \* \* \*